(12) United States Patent
Okuyama et al.

(10) Patent No.: US 9,513,317 B2
(45) Date of Patent: Dec. 6, 2016

(54) CURRENT DETECTION STRUCTURE

(71) Applicant: Hitachi Metals, Ltd., Tokyo (JP)

(72) Inventors: Ken Okuyama, Hitachi (JP); Naofumi Chiwata, Mito (JP); Katsuya Akimoto, Hitachi (JP); Naoki Futakuchi, Hitachinaka (JP); Yukio Ikeda, Hitachi (JP); Kazuhisa Takahashi, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 4 days.

(21) Appl. No.: 14/600,716

(22) Filed: Jan. 20, 2015

(65) Prior Publication Data

US 2015/0204915 A1    Jul. 23, 2015

(30) Foreign Application Priority Data

Jan. 21, 2014  (JP) ................ 2014-008775

(51) Int. Cl.
*G01R 15/00* (2006.01)
*G01R 19/00* (2006.01)
(Continued)

(52) U.S. Cl.
CPC ......... *G01R 19/0092* (2013.01); *G01R 15/207* (2013.01); *G01R 33/093* (2013.01); *G01R 15/205* (2013.01)

(58) Field of Classification Search
CPC . G01R 15/205; G01R 15/207; G01R 19/0092; G01R 33/093
See application file for complete search history.

(56) References Cited

U.S. PATENT DOCUMENTS 6,040,690 A * 3/2000 Ladds .................. G01R 21/08
324/117 H
9,234,948 B2 * 1/2016 Deak .................... G01R 33/098
(Continued)

FOREIGN PATENT DOCUMENTS

DE    29804737 U1    5/1998
DE    10051160 A1    5/2002
(Continued)

OTHER PUBLICATIONS

Extended European Search Report dated Jul. 9, 2015.

*Primary Examiner* — Julian Huffman
*Assistant Examiner* — Michael Konczal
(74) *Attorney, Agent, or Firm* — Roberts Mlotkowski Safran Cole & Calderon, PC

(57) ABSTRACT

A current detection structure includes a busbar to flow a current therethrough, a magnetic detection element to detect a strength of a magnetic field generated by the current flowing through the busbar, and a current detecting portion to determine the current flowing through the busbar based on the magnetic field detected by the magnetic detection element. A through-hole is formed penetrating the busbar such that a current path is formed on both sides of the through-hole. The magnetic detection element is disposed in the through-hole. The current detecting portion determines the current flowing through the busbar based on a strength of a synthetic magnetic field detected by the magnetic detection element. The synthetic magnetic field is produced by combining a magnetic field that is generated by a current flowing through the current path on the both sides of the through-hole.

11 Claims, 4 Drawing Sheets

(51) Int. Cl.
*G01R 33/09* (2006.01)
*G01R 15/20* (2006.01)

(56) References Cited

U.S. PATENT DOCUMENTS

| | | | | |
|---|---|---|---|---|
| 2009/0021249 A1* | 1/2009 | Kumar | ............ | G01R 15/207 |
| | | | | 324/227 |
| 2010/0026286 A1* | 2/2010 | Koss | ............ | G01R 15/207 |
| | | | | 324/244 |
| 2013/0335076 A1* | 12/2013 | Sakamoto | ............ | G01R 15/207 |
| | | | | 324/244 |

FOREIGN PATENT DOCUMENTS

| | | | | |
|---|---|---|---|---|
| DE | 10054016 A1 * | 5/2002 | ........ | G01R 15/207 |
| DE | 102004050019 A1 | 6/2006 | | |
| JP | 2006184269 A | 7/2006 | | |
| JP | 2010-008315 | 1/2010 | | |
| JP | 2013-170878 | 9/2013 | | |
| WO | 2013038867 A1 | 3/2013 | | |

* cited by examiner

7 CURRENT DETECTING PORTION

CURRENT DETECTION STRUCTURE

The present application is based on Japanese patent application No.2014-008775 filed on Jan. 21, 2014, the entire contents of which are incorporated herein by reference.

BACKGROUND OF THE INVENTION

1. Field of the Invention

The invention relates to a current detection structure.

2. Description of the Related Art

A magnetic detection element is used for detecting the strength of a magnetic field generated by a current flowing through a busbar. From the magnetic field strength detected by the magnetic detection element, it is possible to derive the current flowing through the busbar by calculation.

MR (Magneto Resistance) sensors and GMR (Giant Magneto Resistive effect) sensors are known as the magnetic detection element.

Prior art related to the invention of the present application may include e.g. JP-B-5153481 and JP-A-2013-170878.

SUMMARY OF THE INVENTION

It is desired to use a higher sensitivity magnetic detection element such as GMR sensor so as to conduct a more accurate measurement.

However, if a large current flows through the busbar, e.g., in case of detecting a current flowing in each phase of a three-phase motor, the strength of a magnetic field generated by the current flowing through the busbar may be too large. Thus, it is difficult to use a high sensitivity magnetic detection element such as GMR sensor.

It is an object of the invention to provide a current detection structure that allows the use of a high sensitivity magnetic detection element even if a large current flows through the busbar so as to conduct a more accurate measurement.

(1) According to one embodiment of the invention, a current detection structure comprises:

a busbar to flow a current therethrough;

a magnetic detection element to detect a strength of a magnetic field generated by the current flowing through the busbar; and a current detecting portion to determine the current flowing through the busbar based on the magnetic field detected by the magnetic detection element, wherein a through-hole is formed penetrating the busbar such that a current path is formed on both sides of the through-hole, wherein the magnetic detection element is disposed in the through-hole, wherein the current detecting portion determines the current flowing through the busbar based on a strength of a synthetic magnetic field detected by the magnetic detection element, and wherein the synthetic magnetic field is produced by combining a magnetic field that is generated by a current flowing through the current path on the both sides of the through-hole.

In the above embodiment (1) of the invention, the following modifications and changes can be made.

(i) The magnetic detection element is arranged such that a detection axis thereof is along a thickness direction of the busbar.

(ii) The magnetic detection element comprises a GMR sensor.

(iii) The magnetic detection element is arranged at a position where a magnetic flux density of the synthetic magnetic field is more than 0 and not more than 5 mT.

(iv) The magnetic detection element is arranged at a position where a magnetic flux density of the synthetic magnetic field is more than 0 and not more than 2 mT.

(v) The though-hole is formed to have a symmetrical shape with respect to a central axis of the busbar, wherein the current path is formed symmetrically on the both sides of the though-hole, and the magnetic detection element is arranged off the central axis of the busbar.

(vi) The magnetic detection element is arranged at a center of the through-hole in a longitudinal direction of the busbar.

(vii) The current path on the both sides of the through-hole is linearly formed along a longitudinal direction of the busbar.

(viii) The current flowing through the busbar has a frequency of not more than 100 kHz, wherein the busbar comprises copper or a copper alloy, and wherein the current path on the both sides of the through-hole has a width of not more than 0.5 mm.

(ix) The magnetic detection element comprises a GMR sensor, and wherein a center of the magnetic detection element in a thickness direction of the busbar coincides with a center of the busbar in the thickness direction thereof.

EFFECTS OF THE INVENTION

According to one embodiment of the invention, a current detection structure can be provided that allows the use of a high sensitivity magnetic detection element even if a large current flows through the busbar so as to conduct a more accurate measurement

BRIEF DESCRIPTION OF THE DRAWINGS

Next, the present invention will be explained in more detail in conjunction with appended drawings, wherein:

FIGS. 1A and 1B are diagrams illustrating a current detection structure in an embodiment of the present invention, wherein FIG. 1A is a perspective view and FIG. 1B is a plan view;

DETAILED DESCRIPTION OF THE PREFERRED EMBODIMENTS

Embodiments of the invention will be described below in conjunction with the appended drawings.

Figure 1A:
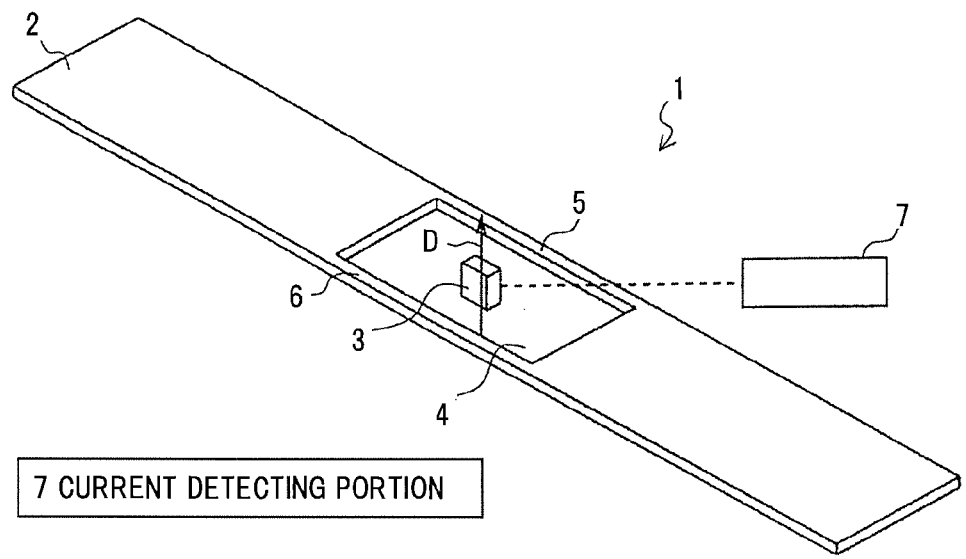
Figure 1B:
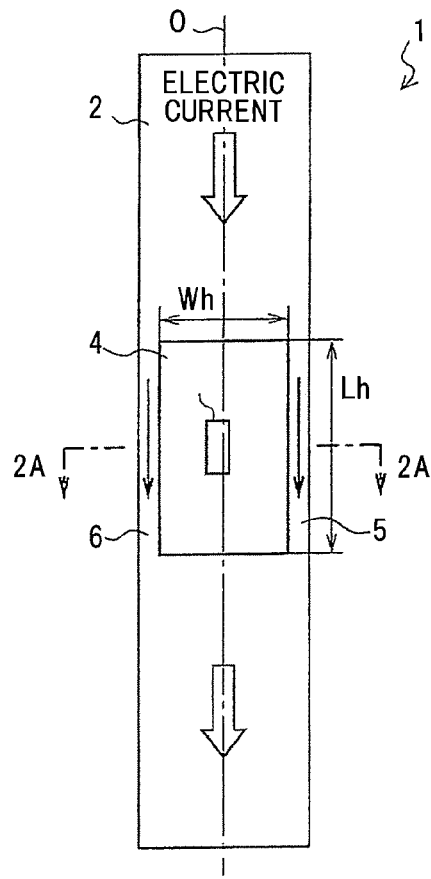
Figure 2:
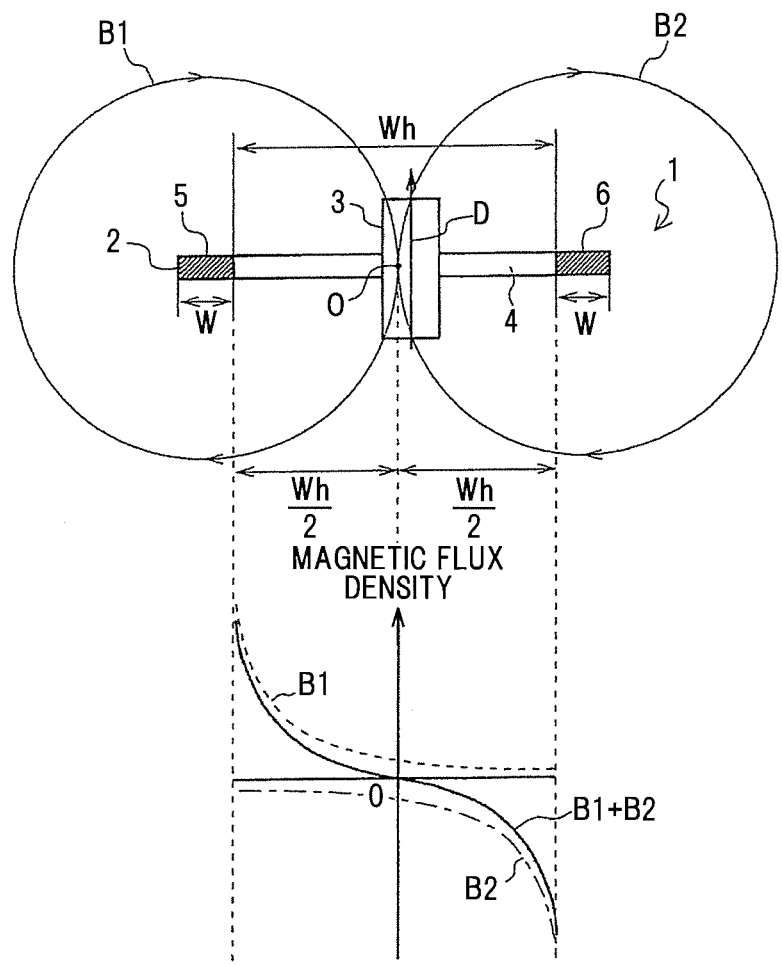
FIG. 2 is a cross sectional view taken on line 2A-2A in FIG. 1B and a diagram illustrating magnetic flux density distribution on the 2A-2A line cross section.

FIGS. 1A and 1B are diagrams illustrating a current detection structure in the present embodiment, wherein FIG. 1A is a perspective view and FIG. 1B is a plan view. FIG. 2 is a cross sectional view taken on line 2A-2A in FIG. 1B and a diagram illustrating magnetic flux density distribution on the 2A-2A line cross section.

As shown in FIGS. 1A to 2, a current detection structure 1 is provided with a busbar 2 for carrying a current along a longitudinal direction thereof and a magnetic detection element 3 for measuring strength of a magnetic field generated by the current flowing through the busbar 2. The current detection structure 1 is to detect a current flowing through the busbar 2 which is provided on, e.g., an inverter of a vehicle.

The busbar 2 is a plate-shaped conductor and serves as a current path for carrying a current. The current flowing through the busbar 2 is, e.g., up to about 200 A in a steady state and up to about 800 A as inrush current in an abnormal state, etc., and has a frequency of, e.g., up to about 100 kHz.

The magnetic detection element 3 is configured to output a voltage output signal according to magnetic field strength (magnetic flux density) in a direction along a detection axis D. In the present embodiment, a GMR sensor having a high sensitivity is used as the magnetic detection element 3.

In the current detection structure 1 of the present embodiment, a through-hole 4 is formed on the busbar 2 so as to penetrate therethrough and the magnetic detection element 3 is arranged in the through-hole 4. The magnetic detection element 3 is arranged so that the detection axis D thereof is along a thickness direction of the busbar 2. In other words, the magnetic detection element 3 is arranged so that the detection axis D thereof is orthogonal to the surface of the busbar 2. When the magnetic detection element 3 is a GMR sensor, the magnetic detection element 3 has two or more detection axes and one specific axis is perpendicular to the surface of the busbar 2. The detection axis D of the magnetic detection element 3 may be inclined about −10° to 10° with respect to a direction orthogonal to the surface of the busbar 2.

The through-hole 4 is formed in the middle of the busbar 2 so as to penetrate therethrough and is thus surrounded by the busbar 2. In other words, the through-hole 4 is not a cutout which partially opens to a lateral side of the busbar 2. By forming such a through-hole 4, current paths 5 and 6 are formed on the both sides of the through-hole 4.

Since the current paths 5 and 6 are formed on the both sides of the through-hole 4, magnetic field components in a thickness direction generated by the two current paths 5 and 6 cancel each other out in the through-hole 4. Here, what the magnetic detection element 3 arranged in the through-hole 4 detects is strength of a synthetic magnetic field produced by combining magnetic fields respectively generated by currents flowing through the current paths 5 and 6 on the both sides of the through-hole 4, i.e., strength of the magnetic fields generated in the current paths 5 and 6 and then cancelled each other out. Therefore, by adjusting a position of the magnetic detection element 3, the degree of cancellation can be adjusted and strength of the magnetic field to be detected can be thereby adjusted to the optimum level.

The current detection structure 1 is also provided with a current detecting portion 7. The current detecting portion 7 is to detect a current flowing through the busbar 2 based on magnetic field strength which is the strength of the synthetic magnetic field produced by combining magnetic fields respectively generated by currents flowing through the current paths 5 and 6 on the both sides of the through-hole 4 and is detected by the magnetic detection element 3. The current detecting portion 7 is provided on, e.g., an ECU (Electronic Control Unit) of a vehicle.

That is, in the current detection structure 1, the magnetic detection element 3 can detect the magnetic field with appropriate strength even when the current flowing through the busbar 2 is high and strength of magnetic field generated by each of the current paths 5 and 6 is large since the large magnetic fields cancel each other out. Therefore, a high sensitivity GMR sensor can be used as the magnetic detection element 3 for measurement.

In case of using the GMR sensor as the magnetic detection element 3, it is desirable that the magnetic detection element 3 be arranged at a position where a magnetic flux density of the synthetic magnetic field produced by combining magnetic fields generated in the current paths 5 and 6 is more than 0 and not more than 5 mT. This is because output of a general GMR sensor is saturated at a magnetic flux density of more than 5 mT and it makes measurement difficult. The magnetic flux density here is the magnitude in a steady state and the case of temporality exceeding 5 mT in an abnormal state or a transient state is taken as an exception.

More desirably, the magnetic detection element 3 be arranged at a position where a magnetic flux density of the synthetic magnetic field produced by combining magnetic fields generated in the current paths 5 and 6 (the magnetic flux density in a steady state) is more than 0 and not more than 2 mT since a range in which the magnetic flux density can be accurately detected (a range in which the magnetic flux density and output voltage are linear) is generally not more than 2 mT in the GMR sensor.

Arranging the magnetic detection element 3 in the through-hole 4 herein means that at least a portion of the magnetic detection element 3 is housed in the through-hole 4, in other words, at least a portion of the magnetic detection element 3 overlaps the busbar 2 as viewed on a horizontal cross section (or as viewed from a side). In the current detection structure 1, the magnetic detection element 3 is arranged so that the center thereof (the center of the magnetic detection element 3 in the thickness direction of the busbar 2 (vertical direction in FIG. 2)) coincides with the center of the busbar 2 in the thickness direction thereof. Thus, when the GMR sensor is used as the magnetic detection element 3, the magnetic fields enter the magnetic detection element 3 only in a direction parallel to the detection axis D of the magnetic detection element 3 and this allows currents to be easily detected with high accuracy.

Currents with a component in a width direction flow in the vicinity of longitudinal end portions of the through-hole 4, which causes an error. Therefore, it is desirable to arrange the magnetic detection element 3 at a position spaced from the longitudinal end portions of the through-hole 4 so as not to be affected by the currents with a component in a width direction, and it is preferable to arrange the magnetic detection element 3 at the center of the through-hole 4 in the longitudinal direction of the busbar 2. Taking the magnitude of the current flowing through the busbar 2 into calculation, a length Lh of the through-hole 4 is determined so that the magnetic detection element 3 can be arranged at a position not affected by magnetic fields generated in the vicinity of the longitudinal end portions of the through-hole 4.

In present embodiment, the though-hole 4 is formed to have a symmetrical shape with respect to a central axis O of the busbar 2 and the current paths 5 and 6 are formed symmetrically on the both sides of the though-hole 4. By such a configuration, magnetic fields are generated symmetrically from the current paths 5 and 6.

As shown in FIG. 2, in the though-hole 4, distribution of a magnetic flux density B1 generated by the current path 5 and distribution of a magnetic flux density B2 generated by the current path 6 are substantially inversely proportional to distances from the current paths 5 and 6 and directions of the magnetic flux densities B1 and B2 generated by the current paths 5 and 6 are opposite to each other. By symmetrically forming the current paths 5 and 6 on the both sides of the though-hole 4, the magnetic fields generated in the two current paths 5 and 6 completely cancel each other out on the central axis O of the busbar 2, resulting in magnetic flux density (B1+B2) of 0. In the graph of FIG. 2, distribution of the magnetic flux density B1 which is generated by the current path 5 shown on the left side of the drawing is indicated by a thin dotted line, distribution of the magnetic flux density B2 which is generated by the current path 6 shown on the right side of the drawing is indicated by a thin dash-dot line, and distribution of the magnetic flux density (B1+B2) produced by combining the magnetic flux densities generated by the two current paths 5 and 6 is indicated by a thick solid line.

Therefore, the magnetic detection element 3 when arranged at an appropriate position off the central axis O of the busbar 2 can detect the optimal level of magnetic flux density (B1+B2) and it is thus possible to carry out measurement with high accuracy. Arranging the magnetic detection element 3 at a position off the central axis O of the busbar 2 here means that the center of the magnetic detection element 3 in the width direction of the busbar 2 is shifted from the central axis O in the width direction. Therefore, a portion of the magnetic detection element 3 may be on the central axis O.

In addition, in the current detection structure 1, the distribution of the magnetic flux density (B1+B2) produced by combining the magnetic flux densities generated by the two current paths 5 and 6 is relatively close to flat in the vicinity of the central axis O of the busbar 2, which allows an error due to disturbance to be reduced and provides excellent robustness. Since the distribution of the magnetic flux density (B1+B2) in the vicinity of the central axis O becomes flatter with an increase in a width Wh of the through-hole 4, the width Wh of the through-hole 4 is desirably as large as possible from the viewpoint of improving the robustness.

Preferably, taking the frequency of the current flowing through the busbar 2 into calculation, a width W of the current paths 5 and 6 is determined so that the influence of the skin effect can be suppressed. Since a skin depth at a frequency of 100 kHz is about 0.2 mm when using copper or copper alloy for the busbar 2, the width W of the current paths 5 and 6 in the present embodiment is desirably not more than 0.5 mm, more desirably not more than 0.2 mm. At a frequency of 10 kHz, the skin depth is about 1 mm and the width W of the current paths 5 and 6 in such a case is desirably not more than 2 mm, more desirably not more than 1 mm.

In this regard, however, if the width W of the current paths 5 and 6 is reduced too much, resistance is increased due to a decrease in the cross sectional area of the current paths 5 and 6, resulting in increases in loss and heat generation. Therefore, the width W of the current paths 5 and 6 and the width Wh of the through-hole 4 should be appropriately set in view of the influence of the skin effect and acceptable loss and heat generation, etc.

Preferably, also taking the frequency of the current flowing through the busbar 2 into calculation, a thickness of the current paths 5 and 6 is determined so that the influence of the skin effect can be suppressed. When copper or copper alloy is used for the busbar 2 and the frequency of the current flowing through the busbar 2 is not more than 100 kHz, the thickness of the current paths 5 and 6 is desirably not more than 0.5 mm, more desirably not more than 0.2 mm. Meanwhile, when the frequency of the current flowing through the busbar 2 is not more than 10 kHz, the thickness of the current paths 5 and 6 is desirably not more than 2 mm, more desirably not more than 1 mm.

Figure 3:
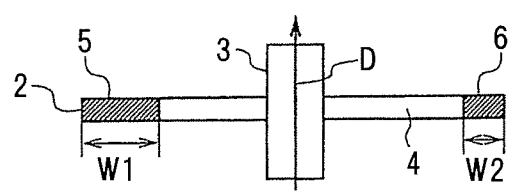
FIG. 3 is a cross sectional view showing a current detection structure in a modification of the invention.

In the present embodiment, the though-hole 4 is formed to have a symmetrical shape with respect to the central axis O of the busbar 2 and the current paths 5 and 6 are formed symmetrically on the both sides of the though-hole 4. However, the current paths 5 and 6 on the both sides of the though-hole 4 may be formed asymmetrically as shown in FIG. 3 or the though-hole 4 may have an asymmetrical shape. FIG. 3 shows an example in which a width W1 of the current path 5 on the left side of the drawing is larger than a width W2 of the current path 6 on the right side of the drawing and, in such a case, it is possible to arrange the magnetic detection element 3 on the central axis O of the busbar 2 or on the widthwise center of the though-hole 4.

However, the widths W1 and W2 need to be adjusted so as not to be significantly different from each other since, if the difference between the width W1 of the current path 5 and the width W2 of the current path 6 is increased, reverse current, etc., occurs and causes an error.

In addition, in case that the current paths 5 and 6 are formed asymmetrically or the though-hole 4 has an asymmetrical shape, a difference between currents flowing through the two current paths 5 and 6 is generated and causes a difference in strength between magnetic fields generated in the two current paths 5 and 6. This causes the magnetic flux density distribution to be uneven unlike the uniform distribution shown in FIG. 2, which may cause susceptibility to disturbance in a specific direction. Therefore, from the viewpoint of increasing the robustness, though-hole 4 formed to have a symmetrical shape with respect to the central axis O of the busbar 2 and the current paths 5 and 6 formed symmetrically on the both sides of the though-hole 4 are more desirable.

Figure 4A:
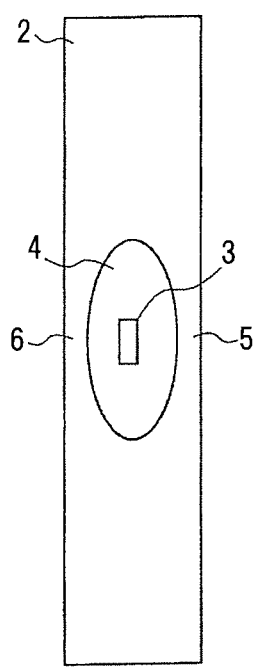
FIGS. 4A and 4B are plan views showing current detection structures in other modifications of the invention.
Figure 4B:
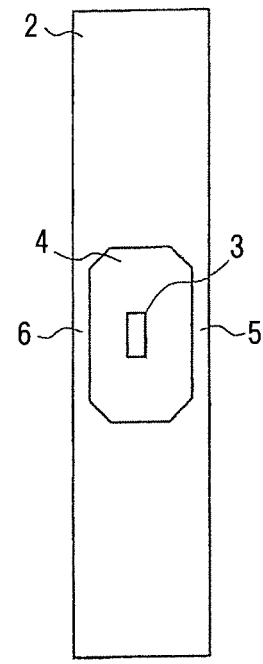

In addition, although the though-hole 4 in the present embodiment is formed in a rectangular shape in a plan view, the shape of the though-hole 4 is not limited thereto and the though-hole 4 may have, e.g., an ellipse shape as shown in FIG. 4A or a polygonal shape as shown in FIG. 4B. In case that the though-hole 4 has the shape as shown in FIG. 4A or 4B, however, currents with a component in a width direction are generated in the current paths 5 and 6 and cause an error. Therefore, the current paths 5 and 6 linearly formed on the both sides of the though-hole 4 along the longitudinal direction of the though-hole 4 are more preferable.

As described above, in the current detection structure 1 of the present embodiment, the through-hole 4 is formed to penetrate the busbar 2 so that the current paths 5 and 6 are formed on the both sides of the through-hole 4, the magnetic detection element 3 is arranged in the through-hole 4, and the current detecting portion 7 detects the electric current flowing through the busbar 2 based on magnetic field strength which is the strength of the synthetic magnetic field produced by combining magnetic fields respectively generated by the currents flowing through the current paths 5 and 6 on the both sides of the through-hole 4 and is detected by the magnetic detection element 3.

Due to such a configuration, the magnetic detection element 3 can detect strength of the magnetic fields generated in the current paths 5 and 6 and then cancelled each other out, and strength of the magnetic field to be detected can be adjusted to the optimum level by adjusting a position of the magnetic detection element 3. As a result, it is possible to use a high sensitivity magnetic detection element 3 such as GMR sensor even when a large current flows through the busbar 2, and it is thus possible to carry out measurement with high accuracy.

Figure 5:
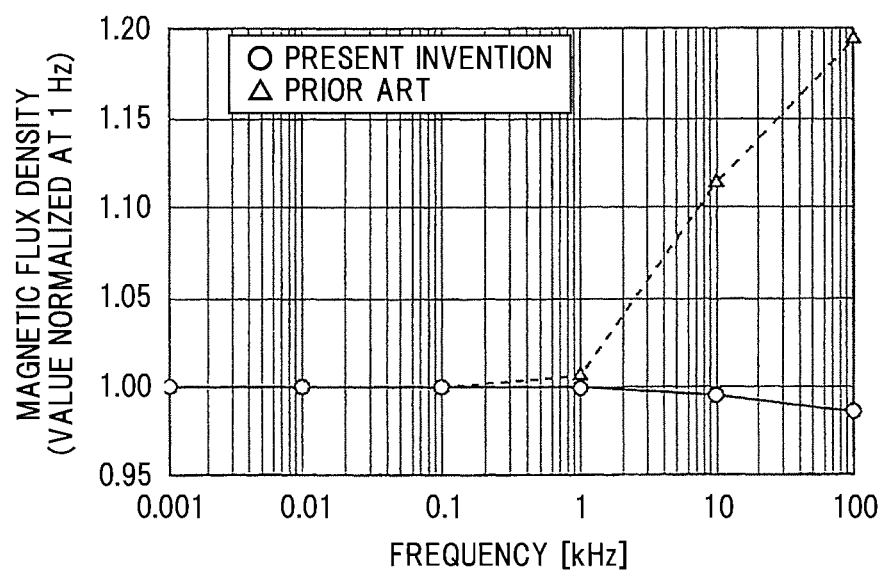
FIG. 5 is a graph showing frequency dependence characteristics of magnetic flux density detected in the invention.

In addition, in the current detection structure 1, by adjusting the width W or thickness of the current paths 5 and 6 according to the frequency of the current flowing through the busbar 2, it is possible to suppress the influence of the skin effect and thereby to reduce frequency dependence. In an example of the conventional art in which the magnetic detection element 3 is arranged in the vicinity of the busbar 2 without forming the through-hole 4 on the busbar 2, the magnetic flux density increases with increasing frequency as shown in FIG. 5, hence, high frequency dependence. On the other hand, in the current detection structure 1 of the present embodiment (the present invention), variation in magnetic flux density due to the frequency is very small and is reduced by about 1.4% in a frequency range of 1 Hz to 100 kHz in the example shown in the drawing.

Next, another embodiment of the invention will be described.

Figure 6:
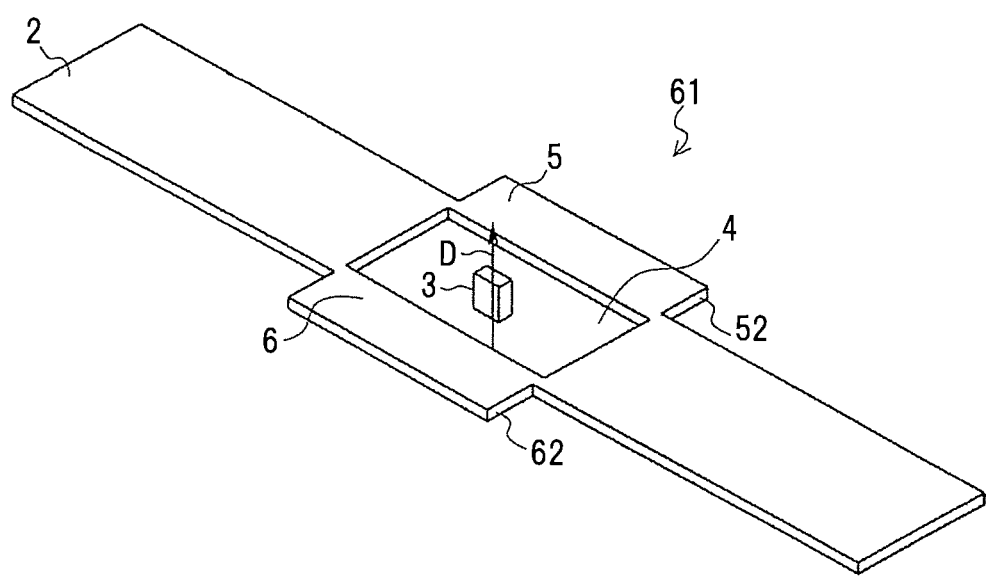
FIG. 6 is a perspective view showing a current detection structure in another embodiment of the invention.

A current detection structure 61 shown in FIG. 6 is based on the current detection structure 1 of FIG. 1 and is provided with protruding portions 52 and 62 which are integrally formed with the current paths 5 and 6 so as to protrude the lateral sides of the busbar 2 (to protrude outward in the width direction). It is possible to increase the cross sectional area of the current paths 5 and 6 by forming the protruding portions 52 and 62, which allows an increase in resistance due to forming the through-hole 4 to be suppressed and a resulting increase in loss or heat generation to be reduced.

The total cross sectional area of the current paths 5 and 6 should be not less than 10 mm$^2$ per 1 A of current flowing through the busbar 2. This is because, if the total cross sectional area of the current paths 5 and 6 is less than 10 mm$^2$ per 1 A of current flowing through the busbar 2, a non-negligible increase in loss occurs and heat generation is also increased.

When the protruding portions 52 and 62 are formed, the increased width W of the current paths 5 and 6 may cause deterioration in frequency dependence but does not cause any problems if the frequency of the current flowing through the busbar 2 is small. In other words, the current detection structure 61 is effective particularly when the frequency of the current flowing through the busbar 2 is small enough to eliminate necessity of considering the skin effect and when a problem of heat generation occurs due to large current.

Although the protruding portions 52 and 62 are formed to increase the cross sectional areas of the current paths 5 and 6 in the current detection structure 61, it is not limited thereto. The cross sectional areas of the current paths 5 and 6 may be increased by increasing the thickness thereof.

As such, the invention is not intended to be limited to the embodiments, and it is obvious that the various kinds of modification can be implemented without departing from the gist of the present invention.

What is claimed is:

1. A current detection structure, comprising:
   a busbar to flow a current therethrough;
   a magnetic detection element to detect a strength of a magnetic field generated by the current flowing through the busbar; and
   a current detecting portion to determine the current flowing through the busbar based on the magnetic field detected by the magnetic detection element,
   wherein a through-hole is formed penetrating the busbar such that a current path is formed on both sides of the through-hole,
   wherein the magnetic detection element is disposed in the through-hole,
   wherein the current detecting portion determines the current flowing through the busbar based on a strength of a synthetic magnetic field detected by the magnetic detection element,
   wherein the synthetic magnetic field is produced by combining a magnetic field that is generated by a current flowing through the current path on the both sides of the through-hole,
   wherein the magnetic detection element includes a portion which is not accommodated in the through-hole in a thickness direction of the busbar, and
   wherein a central axis in a length direction of the busbar overlaps the magnetic detection element in a plan view.

2. The current detection structure according to claim 1, wherein the magnetic detection element is arranged such that a detection axis thereof is along a thickness direction of the busbar.

3. The current detection structure according to claim 1, wherein the magnetic detection element comprises a GMR sensor.

4. The current detection structure according to claim 3, wherein the magnetic detection element is arranged at a position where a magnetic flux density of the synthetic magnetic field is more than 0 and not more than 5 mT.

5. The current detection structure according to claim 3, wherein the magnetic detection element is arranged at a position where a magnetic flux density of the synthetic magnetic field is more than 0 and not more than 2 mT.

6. The current detection structure according to claim 1, wherein the though-hole is formed to have a symmetrical shape with respect to a central axis of the busbar, wherein the current path is formed symmetrically on the both sides of the though-hole, and the magnetic detection element is arranged off the central axis of the busbar.

7. The current detection structure according to claim 1, wherein the magnetic detection element is arranged at a center of the through-hole in a longitudinal direction of the busbar.

8. The current detection structure according to claim 1, wherein the current path on the both sides of the through-hole is linearly formed along a longitudinal direction of the busbar.

9. The current detection structure according to claim 8, wherein the current flowing through the busbar has a frequency of not more than 100 kHz, wherein the busbar comprises copper or a copper alloy, and wherein the current path on the both sides of the through-hole has a width and a thickness of not more than 0.5 mm to suppress the influence of the skin effect.

10. The current detection structure according to claim 1, wherein the magnetic detection element comprises a GMR sensor, and wherein a center of the magnetic detection element in a thickness direction of the busbar coincides with a center of the busbar in the thickness direction thereof.

11. The current detection structure according to claim 1, wherein the magnetic detection element disposed in the through-hole is a single magnetic detection element.

* * * * *